United States Patent
Pradhan et al.

(10) Patent No.: US 6,970,043 B2
(45) Date of Patent: Nov. 29, 2005

(54) LOW VOLTAGE, LOW POWER DIFFERENTIAL RECEIVER

(75) Inventors: Pravas Pradhan, South Portland, ME (US); Shailesh Chitnis, Portland, ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 347 days.

(21) Appl. No.: 10/645,033

(22) Filed: Aug. 21, 2003

(65) Prior Publication Data

US 2004/0080368 A1 Apr. 29, 2004

Related U.S. Application Data

(63) Continuation-in-part of application No. 10/282,569, filed on Oct. 29, 2002.

(51) Int. Cl.[7] .............................................. H03F 3/45
(52) U.S. Cl. ..................... 330/253; 330/261; 327/359
(58) Field of Search ................... 330/253, 257, 330/259, 261; 327/359

(56) References Cited

U.S. PATENT DOCUMENTS

| | | | |
|---|---|---|---|
| 5,801,564 A | 9/1998 | Gasparik | |
| 5,894,245 A | 4/1999 | Cho | |
| 6,052,025 A | 4/2000 | Chang et al. | |
| 6,150,883 A | * 11/2000 | Ivanov | 330/253 |
| 6,236,269 B1 | 5/2001 | Hojabri | |
| 6,252,432 B1 | 6/2001 | Freitas | |
| 6,275,073 B1 | 8/2001 | Tokuhiro | |
| 6,614,302 B2 | * 9/2003 | Abe | 330/253 |
| 6,657,495 B2 | * 12/2003 | Ivanov et al. | 330/255 |

* cited by examiner

*Primary Examiner*—Henry Choe
(74) *Attorney, Agent, or Firm*—Cesari and McKenna, LLP; Edwin H. Paul, Esq.

(57) ABSTRACT

A folded common cascode circuit with symmetric parallel signal paths from the differential inputs to a single ended output provides a low skew, low jitter, low power, high speed differential amplifier. The signal paths on either side of the differential amplifier are made equal with equal loads along each path. Pairs of complementary NMOS and PMOS transistor pairs with parallel complementary biasing current mirroring stacks on the cascode circuitry have all their gates connected together. The layout maintains symmetrical parallel signal paths and symmetrical amplification and impedance loading from differential input to output. Output inverters provide a higher drive capability.

5 Claims, 8 Drawing Sheets

LOW VOLTAGE, LOW POWER DIFFERENTIAL RECEIVER

RELATED APPLICATIONS

The present application is a continuation in part (CIP) of U.S. patent application Ser. No. 10/282,569 filed Oct. 29, 2002, entitled Low Power Low Voltage Differential Signal Receiver with Improved Skew and Jitter Performance. This application is commonly owned and shares an inventor with the present application and which application is incorporated herein by reference. The present application is also related to U.S. patent application, entitled Low Voltage, Differential In Differential Out Receiver, co-filed with the present application and of common inventorship and ownership.

BACKGROUND OF THE INVENTION

1. Field of the Invention

The present invention relates to interface circuits, and more particularly to Input/Output (I/O) circuits and receivers, and even more particularly to high speed, low voltage, low power, differential input, low jitter and skew I/O receiver circuits (LVDR), with a single ended output signal.

2. Background Information

Low voltage differential signals are common for high speed signal transmission. Saturation effects are avoided and power dissipation is limited, and, since low voltage signals are prone to noise, use of differential signals, where the noise is common to both signals, generally overcomes this problem.

However, since common mode signals will occur, LVDR circuits are designed to accept differential signals that ride on a common mode level that may range from the low power, or ground, rail to the Vcc power rail.

U.S. Pat. Nos. 5,801,564; 6,252,432 B1 and 6,236,269 B1 set out a high speed circuits that operate over a wide input common mode range where each has a differential input and a single ended output. In these patents the differential input signals connect to gates of both an NMOS and a PMOS transistor pair connected source to source, where the NMOS pair handle common mode voltages up to within about 200 millivolts of the high power rail and the PMOS pair down to within about 200 millivolts of the ground. A to second stage converts the differential input to a rail to rail single output signal suitable for driving CMOS inverters. This large output signal dynamic range requires a high gain second stage that reduces the frequency response. Moreover, the combined effect of input signal common mode level on the second stage, and second stage wide dynamic output range, limits practical circuits to higher Vcc levels. Also, when the common mode is input voltage and the second stage output voltage change from the ground rail to the Vcc rail, the cross over (switching point) point for the circuit changes since the currents, the gain, and the impedances all change. This crossover point change increases jitter. If the currents were unchanged over the range of input signal common mode voltage swing, the gains would be about constant thereby reducing jitter over that range of input common mode levels.

There is a need for a differential low voltage receiver with a wide input signal common mode range that reduces power dissipation, skew and jitter, and that operates at lower Vcc levels but maintains high speed (high frequency) operation.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

SUMMARY OF THE INVENTION

In view of the foregoing background discussion, the present invention provides a high speed, low voltage, low power, differential receiver that provides lower skew and jitter over a wide range of common mode input signal levels. The present invention also provides a lower output voltage swing from the second stage that improves the low Vcc performance of the invention.

The present invention includes a folded cascode made up of a differential input stage and a load or current summation stage, and a second differential stage. The differential input stage includes a first NMOS pair and a PMOS pair of differentially connected transistors that accept a rail to rail input common mode signal level. The load or summation stage follows with a full ground to Vcc output signal only at the second differential stage. This arrangement provides a lower gain second stage with a lower output voltage swing, lower power dissipation, better crossover control, high speed, and better jitter and skew performance.

The differential input and load or current summation stages share current sources, and the differential signal is transferred between these stages via these shared current sources. The better performance is due partly to keeping the current sources substantially constant over a wider range of common mode input voltage levels. The reduced signal voltage swings of load or current summation stage allows the current sources to remain operational over a wider range of input common signal levels and at lower Vcc levels than if the output of that stage traversed from ground to Vcc. The reduced load or summation stage output voltage swing also benefits by keeping impedances and cross over points relatively constant over wider ranges of common mode signal levels. The second differential stage does not share currents and is relatively unaffected by the input common mode signal level. This stage provides the higher voltage drive for CMOS inverters, but with the higher currents available this stage performs at high frequencies and its input differential switching threshold remains substantially constant and does not appreciably affect the crossover point.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
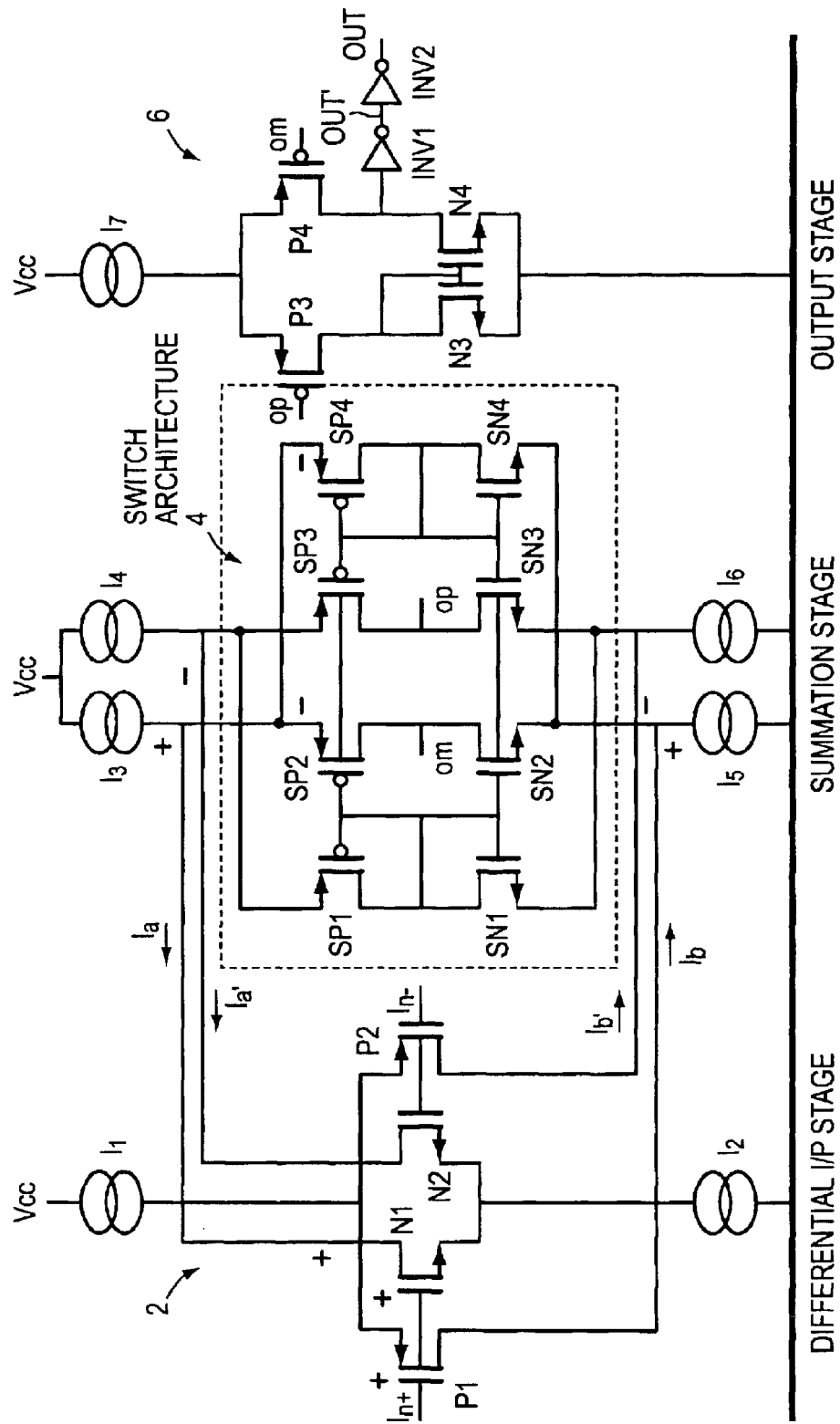
FIG. 1 is a circuit block diagram of the present invention.

FIG. 1 shows a folded cascode circuit with a differential input stage 2 comprised is of source coupled NMOS transistors, N1 and N2, with a current source I2 connecting the sources to ground. There is a parallel set of PMOS transistors, P1 and P2, sharing a current source I1 connecting their sources to the power rail, Vcc. I1 and I2 are complementary current sources, typically of equal value. The value may range widely from microamps to milliamps or more depending on applications. In one preferred embodiment 0.350 milliamps is used. The gates of N1 and P1 are connected together and to an input signal, In+, and the gates of N2 and P2 are similarly connected together and to the complementary input signal, In−. Each of the drains of the input stage NMOS and PMOS transistors are connected, in a folded cascode fashion, to sources of opposite polarity transistors in the load or current summation stage 4. Folded cascode circuits have the beneficial characteristic of a differential input voltage signal input to high impedance gates (or bases, in bipolar circuits) causing an output differential current from their high impedance drains that is fed into low impedance sources. If there were a resistance or other such high impedance loads on the drains, an inverted voltage signal would appear at the drains magnifying the Miller capacitance and thereby limiting the circuit's frequency range. Since the load on the drains are low impedance sources little or no voltage signal appears at the drains of the NMOSs and the Miller capacitance is nullified.

"Designs of Analog CMOS Integrated Circuits" by Behzad Razavi published by McGraw-Hill is a good reference describing folded cascode circuitry and is hereby incorporated herein by reference.

A preferred embodiment of the present invention, as in FIG. 1, has the input NMOS, N1, drain connected to the sources of PMOSs, SP2 and SP4. The drain of NMOS, N2, is similarly connected to the sources of PMOSs, SP1 and SP2. Also, from the input PMOS, P1, drain is connected to the sources of NMOS, SN2 and SN4, and the drain of PMOS, P2, is similarly connected to the sources of NMOS, SN1 and SN2.

In a preferred embodiment, the signal paths are equally balanced between the NMOS and the PMOS circuitry. I1 and I2 are set equal, and I3, I4, I5 and I6 are four complementary current sources that are usually set equal to each other and typically at higher value compared to I1 and I2. Other ratios may be used for other preferred embodiments. At quiescence balance I2 is drawn equally from I3 and I4, and I1 flows equally to I5 and I6. The remaining portion of I3 supplies I5 and that of I4 supplies I6. As practitioners in the art will understand, the current sources are MOS devices configured shown in FIG. 8. Also, as well known in the art, these current sources are operational over a range of voltages, but at some voltages they begin to demonstrate a resistive component.

The input NMOS pair of FIG. 1 allow the common mode input voltage to run at least to Vcc, and the PMOS pair of FIG. 1 allow the common mode input voltage to run at least to ground. The input NMOS transistors are identical with each other, as are the input PMOS transistors to make the circuits as symmetrical as possible. This parallel combination of differential input circuits allows the input common mode voltage to traverse at least from ground to Vcc. This can be seen from FIG. 1 where, if In+ and In− were both at Vcc, the current source I3 would still operate supplying currents to I2 and to SP2 and SP4. Similarly, I4 will supply current to I2 and to SP1 and SP3. As is evident from the schematic, if there were a differential input voltage the currents from I3 and I4 would unequally supply currents for I2 and the remaining currents to SP1, 2, 3 and 4 in proportion to the differential input signal value.

Similarly, if the input In+ and In− were both at about ground, I5 and I6 would still operate in conjunction with SN1, 2, 3, and 4. With a differential between In+ and In−, I5 and I6 would unequally supply currents to I1, with the remaining portions to SN1, 2, 3, and 4.

Figures 2A, 2B:
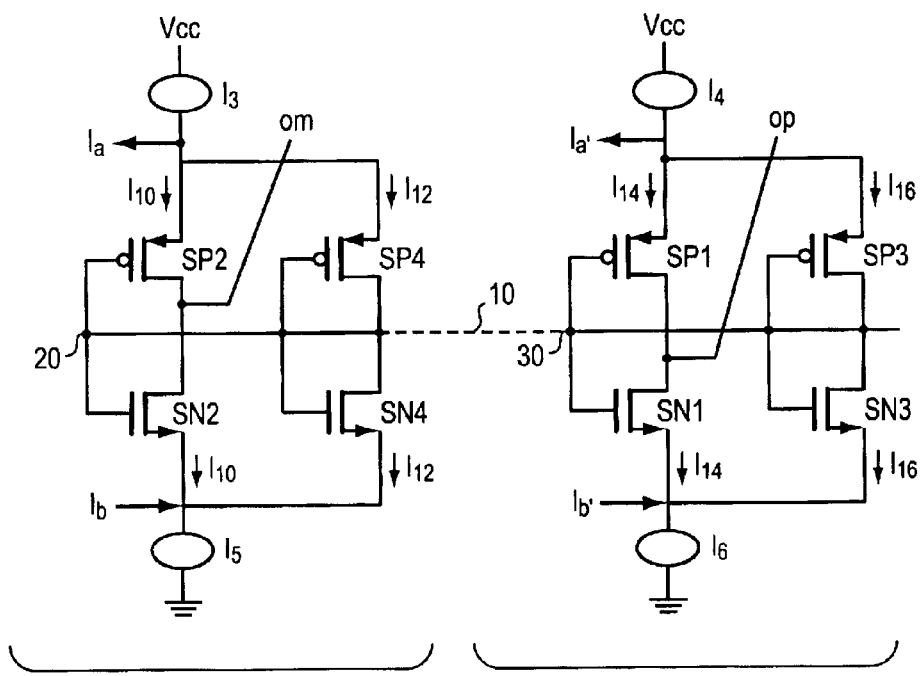
FIGS. 2A and 2B are schematic of the parallel paths in the load or current summation stage of a preferred embodiment.

FIGS. 2A and 2B show the load or current summation stage "unwrapped." With respect to FIG. 2A, SP4 and SN4 form a parallel current path with SP2 and SN2, where the current in SP4 is proportionally smaller but mirrored in SP2 and the current in SN4 is proportionally smaller but mirrored in SN2. The mirrored current values are proportional but are usually made unequal by the sizes of the transistors involved. As is evident from the circuit of FIG. 2 the current through these parallel paths is I3 minus Ia, where Ia is a portion of I2 as determined from the state of the folded cascode stage 2. The current through these parallel paths is also equal to I5 plus Ib, where Ib is a portion of I1 as determined by the state of the cascode stage. So (I3 minus Ia) will equal (I5 plus Ib) until the input voltage levels interfere with the current sources. From a quiescent point, if Ia increases due to In+ increasing (N1 on harder) with respect to In−, then correspondingly Ib will decrease also due to In+ increasing (P1 on less hard). With I10 and I12 reduced at the top of the circuit FIG. 2A, but I5 drawing more current from I10 and I12 at the bottom of the circuit, om will fall in level. Obviously I5 will pull down om to a level where the voltage at I5 causes I5 to lower its nominal value due to a resistive component. The net effect is that I10 and I12 match the currents I3 minus I2 and I5 minus Ib. Similarly, I14 and I16 increases since Ia' is reduced (N2 on less hard) and Ib' increases (P2 on harder) and op will rise. In this instance I4 will demonstrate a resistive component.

The net effect is that In+ going positive with respect to In− drives op positive with respect to om. With respect to FIG. 1 op going positive will drive OUT positive through the two inverters INV1 and INV2.

With respect to FIGS. 1, 2A and 2B, the physical sizes of the transistors involved acting as current mirrors, as is known in the art, will determine the split in current between the two legs. For example I12 may be ten percent and I10 ninety percent of (I3–Ia). Virtually any split may be accomplished by sizing the transistors involved. Also, by setting the current through SP2 and SN2 the resulting voltage at om is determined. Similarly the voltage at op is determined by the current through SP3 and SN3. The actual current levels of the current sources I1–I6, and the ratio of currents between the two parallel paths may be designed for virtually any levels consistent with the processes and circuit operation specifications desired. Higher currents will tend to increase gain/bandwidth but at high power dissipation. Higher current rations of I10 to I12 and of I14 to I16—current in the parallel paths, will tend to increase gain at the expense of bandwidth In FIGS. 2A and 2B, notice that the gates 20 and 30 are tied together via the connection 10. This has the desirable effect of allowing better control of the differential gains in the two circuits and better symmetry.

The net effect is that the voltage gain from In+ and In− to op and om is determined by the currents involved and the sizing of the transistors involved. In other circuits, as mentioned above, op and om may have driving CMOS gates and would be designed to swing from rail to rail. But, in an example of the present invention, a second differential stage is employed, item 6 in FIG. 1. Use of this second stage allows the voltage swing at op and om to be much reduced allowing lower currents, voltage levels and voltage swings to be designed. This improves bandwidth (since less gain), lowers power dissipation (less current), reduces skew and jitter (since the crossover point is better defined), and with the reduced voltage levels and swing the circuit will operate at a lower Vcc.

The overall circuit symmetry also provides low skew and low jitter performance. Here "symmetrical" refers to the parallel circuitry of the In+ or the In− signal paths being identical mirrors of each other including signal path lengths. That is, N1 is an identical mirror of N2, P1 of P2, SP1 of SP4. SN1 of SN4, SP2 of SP3, SN2 of SN3, and so on throughout the biasing and signal path lengths. In the present invention a single ended output is provided through the inverters, see FIG. 1.

With reference to FIGS. 2A and 2B, the right hand sides carrying I12 and I16 are identically laid out as are the left-hand sides carrying I10 and I14. Moreover, the circuit of FIG. 2A is identically arranged as the circuit of FIG. 2B. In one preferred embodiment, the current sources (I1–I6) are 0.350 milliamps each, but other sizes, current ranges and at other proportions may be used to advantage in the present invention.

In this application SP1 and SN1 form a biasing current mirror leg for the signal path SP3 and SN3, as do SP4 and SN4 for the signal path SP2 and SN2.

Expanding on the symmetry discussion, in FIG. 1, following the circuitry from the input through to the output the circuitry is identical and symmetrical so that the loading on each transistor in the two differential paths. Moreover, the layout signal path lengths are designed to be virtually identical. This means that the transistor sizes and parameters, the capacitances, resistances and layout path lengths are all identical along both the In+ and the In− signal paths. This designed symmetry leads to minimized skew.

Jitter is an apparent signal riding on an actual differential signal causing variations in its period. One factor causing jitter is noise. One common source of noise is the power rail, Vcc. The circuit topology and component parameters are made symmetrical so that any signal riding on the power rail appears equally on both sides of the circuitry or in common mode and therefore its contribute to the differential signal is minimized. This factor is called the "power supply rejection ratio," which is the signal gain (output signal value divided by the input signal value divided by a valued calculated from an output signal value due to a signal on the power rail—basically the gain from the power rail to the output).

Figure 3:
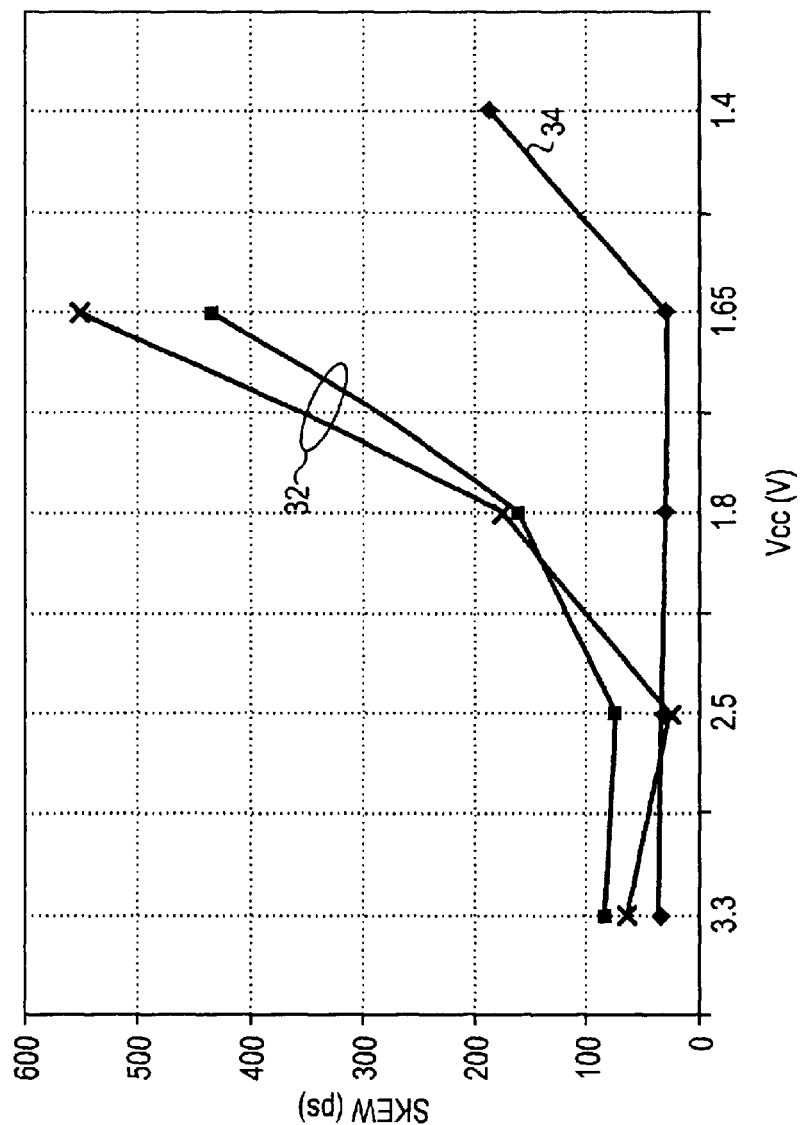
FIG. 3 is a chart of skew performance over Vcc levels.
Figure 4:
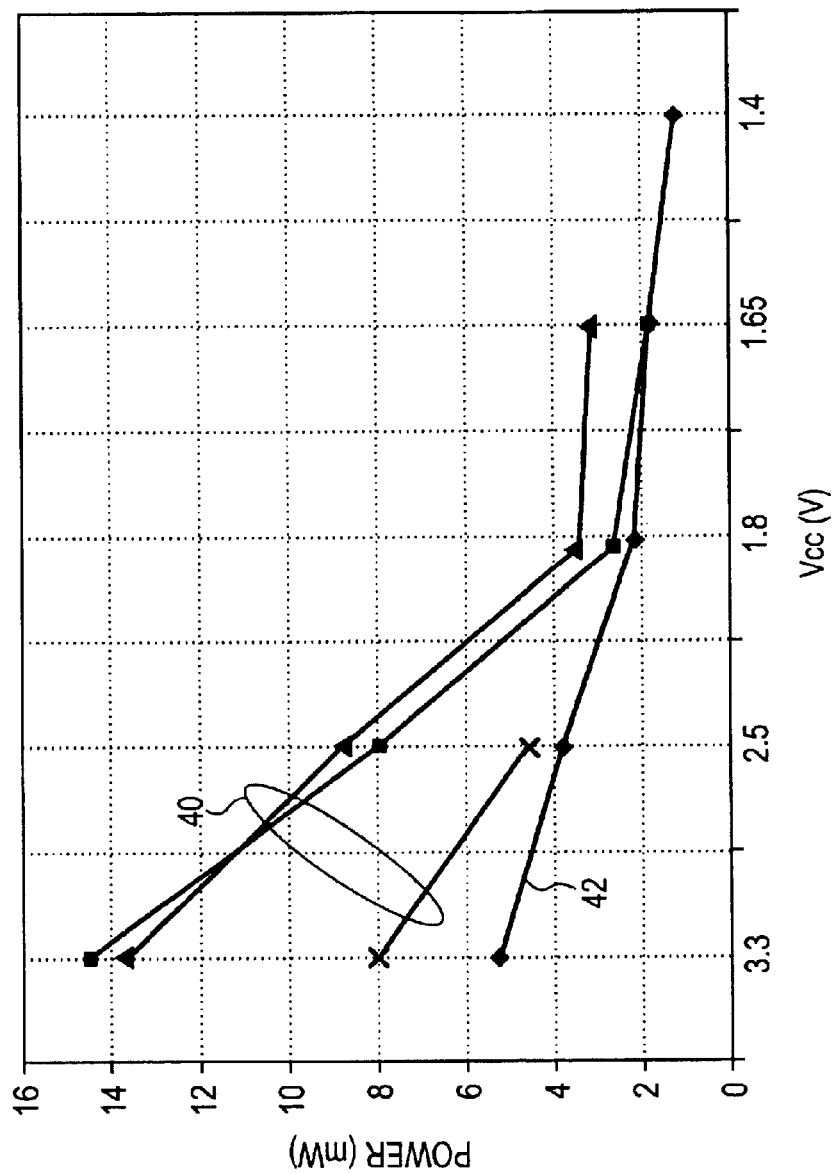
FIG. 4 is a chart of power dissipation over Vcc levels.

FIG. 3 represents skew performance improvement where the trace 34 indicates lower skew as compared to prior art designs 32. FIG. 4 represents power dissipation improvement of the present design 42 compared to prior art designs 40. Notice that FIGS. 3 and 4 have data points at Vcc of 1.4 volts where the prior art designs will not operate. This is due in part to the reduced swings at op and om, where a differential swing of 0.250 between op and om suffices to guaranty switching of the second differential stage.

Figure 5:
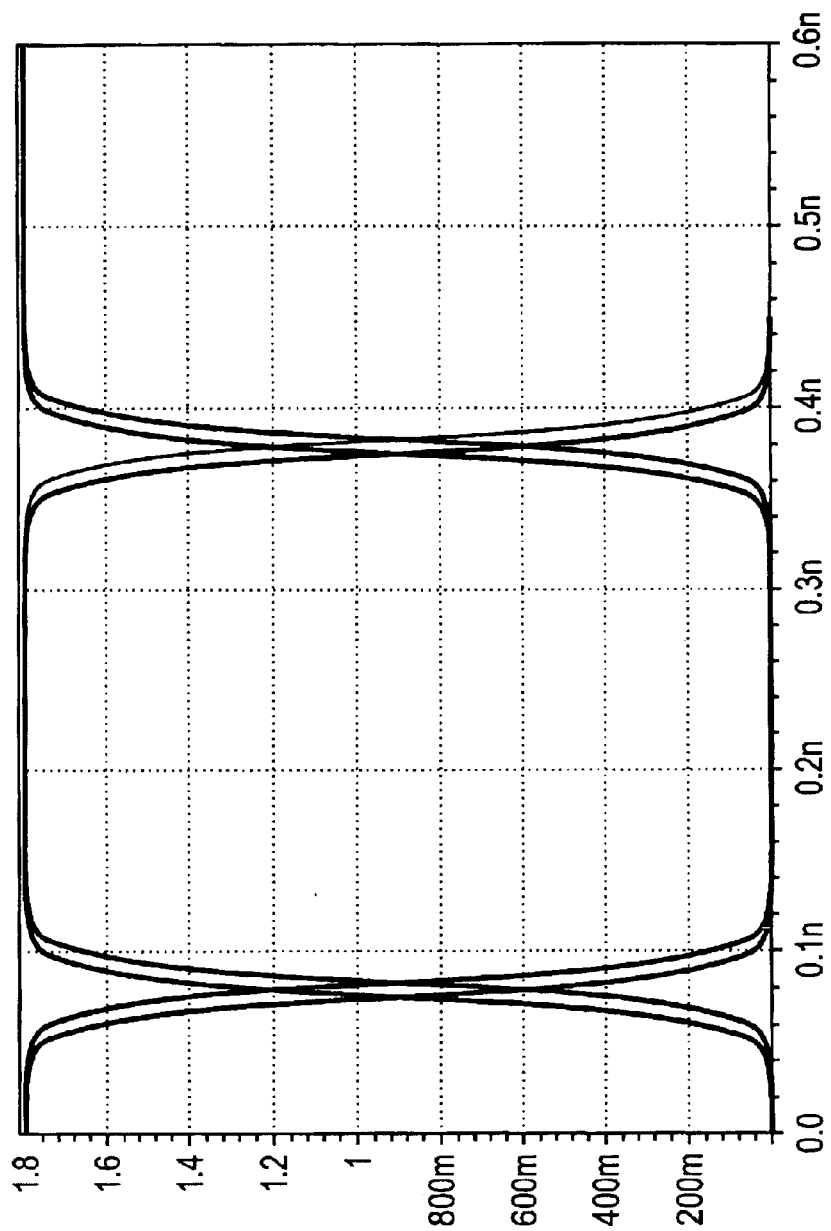
FIG. 5 is a plot showing jitter at Vcc of 1.8V at 150 MHz;.
Figure 6:
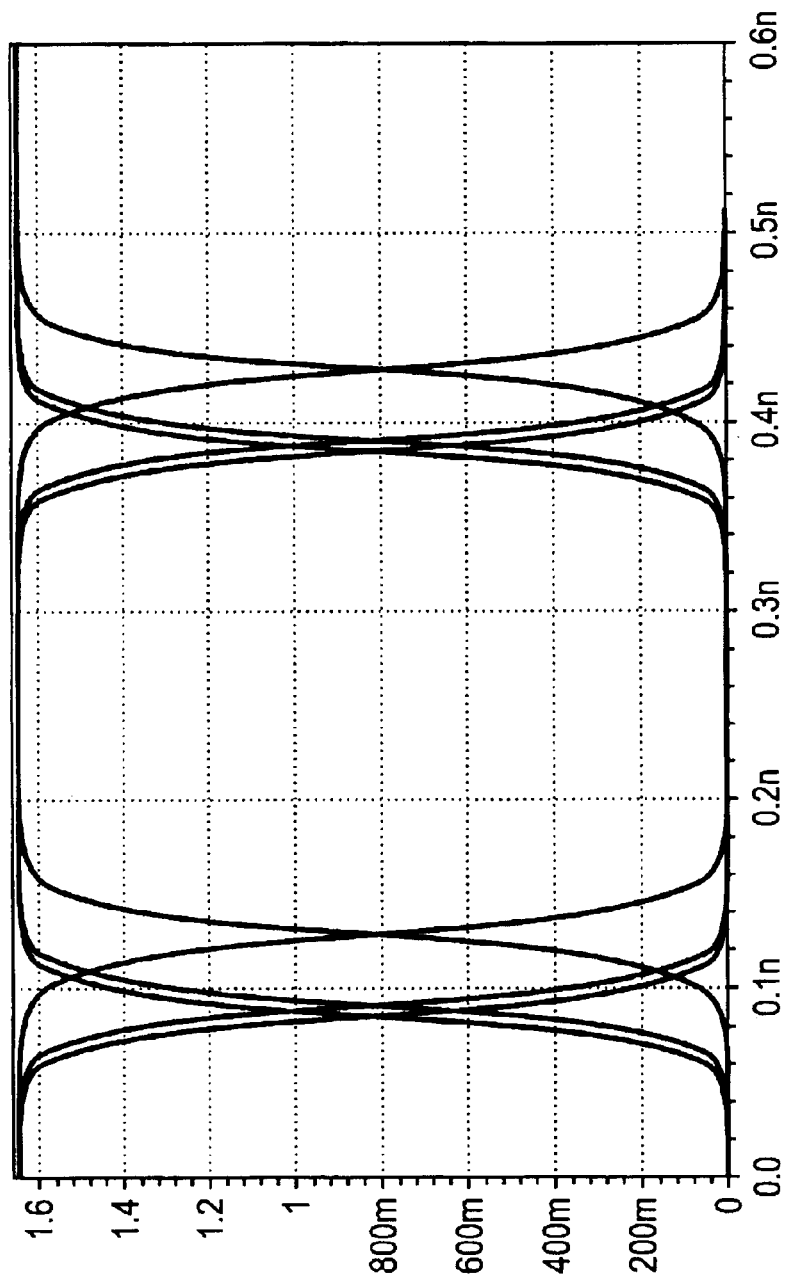
FIG. 6 is a ploy showing jitter at Vcc of 1.65V at 150 MHz.
Figure 7:
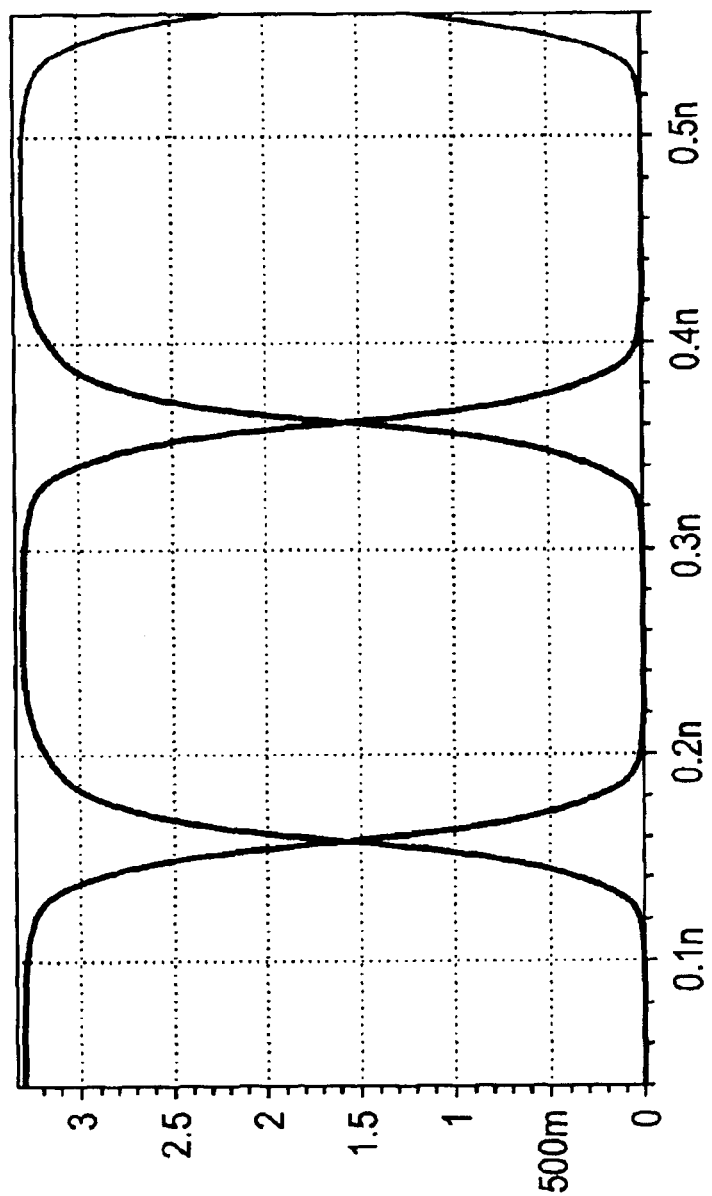
FIG. 7 is a ploy showing jitter at Vcc of 3.3V at 150 MHz.

FIGS. 5, 6, and 7 show jitter performance at 150 MHz as a function of Vcc. These are traces of times responses overlaying each other. The "eye" is a term in the art indicating the cross over differences readable from the traces. FIG. 5 shows difference of about 0.08 ns at the cross over point; FIG. 6 shows about 0.3657 ns, and FIG. 7 shows 0.02 ns.

The differential voltage gain of the folded cascade stage from (In+ minus In−) to (op minus om) is determined by the transconductance of the differential input stage and by the effective transresistance of the load or current summation stage—the value of op and om as determined by the currents through the parallel paths of FIG. 2A and FIG. 2B. Still referring to FIG. 2A the current through each leg I10 and I12 is a function of the current sources and the sizes of the transistors, as is known in the art. In this fashion the voltage gain can be trimmed to a value that preserves high speed operation, wide input common mode levels, and lower power supply operation, together with better skew and jitter performance. In a preferred embodiment, the current sources and the sizes can be is selected so that the input common mode level can run from ground to Vcc and the common mode level of op and om remains well within a few hundred millivolts. This allows the circuit to operate with a Vcc e as low as +1.4V. Moreover, the differential output of the load or current summation stage 4 can be set so that the maximum differential output (op minus om) can be set to a few hundred millivolts. Of course other values can be used in other preferred embodiments. FIG. 1 shows a second differential stage 6 with inputs of op and om. Since the output of this stage provides a full rail to rail output suitable for driving CMOS inverters, the gain can be set by the current source I7 and the sizes of the transistors, as is well known in the art.

From FIG. 1, the gates of all the transistors in the load or current summation stage are connected together. Also, the outer transistors, SP1, SP4, SN1, and SN4 are the biasing legs with their drains and their gates all interconnected with each other. These outer transistors bias the inner transistors, SP2, SP3, SN2, and SN3 that carry a proportional mirrored current, and with the currents differentially distributed, dependent on the input differential signal. The biasing transistors determine the signal at the drains of the inner transistors. This common gate/drain connection allows better control for better symmetry of the differential outputs op and om, thereby improving skew and jitter.

In the above cases the differential output of the load or current summation stage 4 appears between op and om. Op and om drive the gates of a second differential stage differential amplifier, formed from P3 and P4, the current source I7 driving the sources and N3 and N4. A single ended output drives the series inverters INV1 and INV2 producing a non-inverting output OUT.

Figure 8:
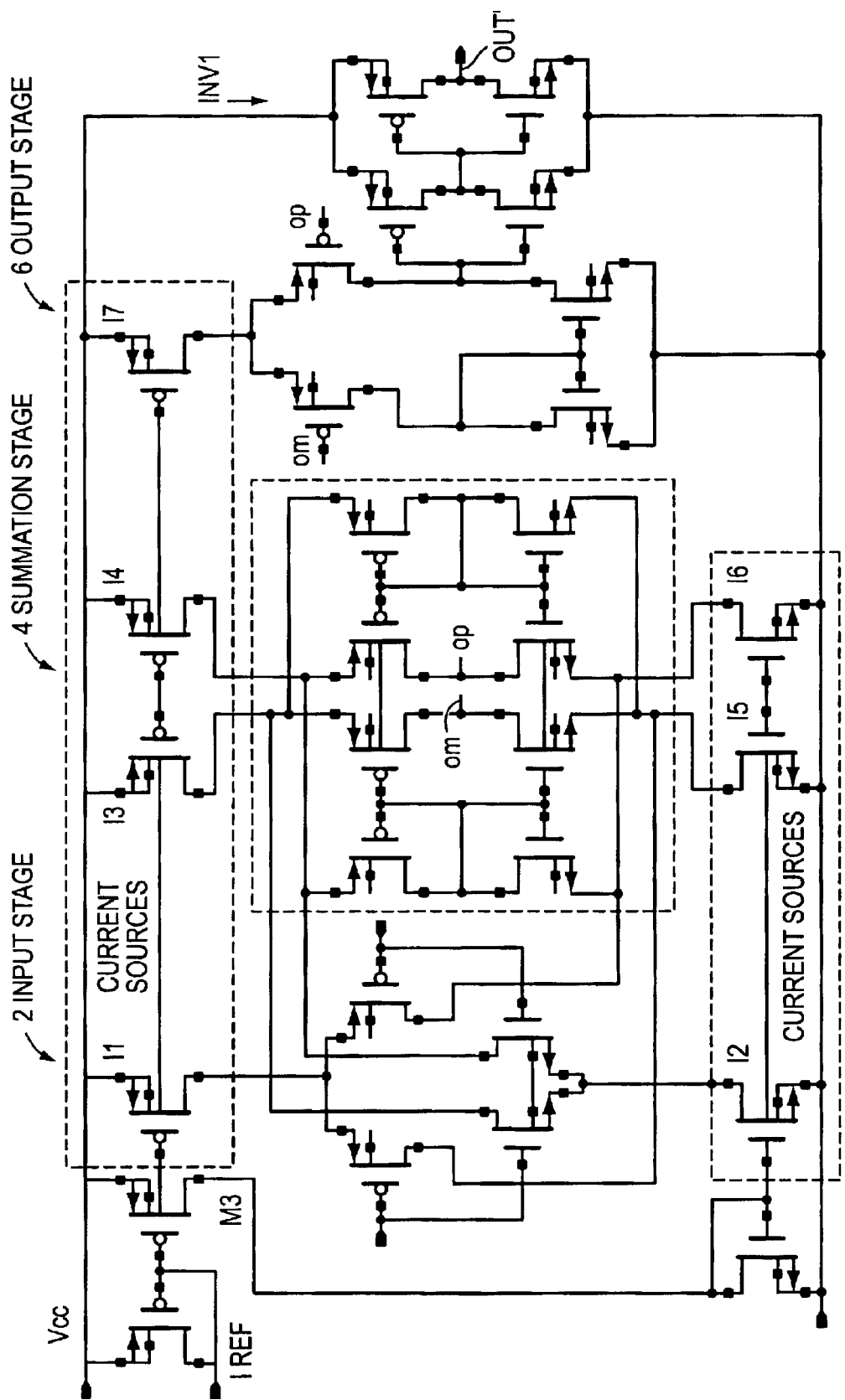
FIG. 8 is a more detailed circuit schematic of the circuit of FIG. 1.

FIG. 8 is a more detailed schematic of FIG. 1, although INV2 is left off FIG. 8. Here the same biasing and signal MOS transistors are shown as described with respect to to FIGS. 1, 2A and 2B. The current source I1–I7 are shown as PMOS and NMOS transistors. The PMOS M3 and NMOS M4 configured between ground and Vcc provide the biasing for the current sources as is known in the art.

Back to FIG. 1, it is helpful review the circuit operation and follow a signal through the schematic. Here a differential signal at a common mode voltage of Vc/2 will is be described traveling through the NMOS transistors, N1 and N2. There will be a corresponding equivalent signal path through P1 and P2.

For description purposes consider both inputs at Vcc/2 and both outputs op and om at Vcc/2 also. This state will typically only exist transiently during switching but the distribution of currents will be clear from the circuitry and from there the differential signals will be evident. In this preferred embodiment example, consider I1 and I2 to be 0.35 milliamps, and I3, I4, I5, and I6 to be 0.420 milliamps. In this balance condition, one half of I2 is supplied equally from I3 and I4 through N1 and N2. And one half of I1 is supplied equally to I5 and I6 through P1 and P2. The remaining portions of I3 supplies the remaining portion of I5, and the remaining portion of I4 supplies the remaining portion of I6, as can be seen from FIGS. 2A and 2B.

Now, from FIGS. 1, 2A and 2B, if In+ is slightly higher than In−, more of I3 travels through N1 leaving less for I10 and I12, and more of I4 will travel through I14 and I16 and less through N2. Similarly, if In+ is higher tan In−, more of I6 travels through P2 leaving less for I14 and I16, and more of I5 will travel through I10 and I12. The result is a higher op with respect to om.

With a large enough differential all of I2 travels through N1 and is supplied from I3 leaving a remainder current for I10 and I12, and correspondingly all on I4 travels through I14 and I16. In this case, with matched current source, all of I1 runs through P2 to I6 and I14 and I16 are reduced and om is lowered. All of I5 travels through I10 and I12 and op is raised. It is evident from such a condition that if I5 is equal to I3 and less of I3 flows into the load or current summation stage paths and more of I5 flow flows from the same paths that there is an unbalance. In such a case the current source, in this case I5, assumes a resistive character such that the currents into and out from the same current paths match. Similar occurrences occur for I3, I4 and I6. Also, In+ or In− may reach levels where I1 or I2 cannot function as current source. In this case those current sources assume a resistive character such that the current balance, but at those extremes the circuit may still operate.

Since there will always be currents through all the current legs in the load or current summation stage the common mode level at op and om and the differential can be controlled by the current levels and the transistor sizes as mentioned before to be lower than the Vcc and higher than ground.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A low voltage differential amplifier architecture with differential input signals, comprising,
   - a first stage comprising a first set of common source connected first identical NMOS transistors and parallel first identical PMOS transistors with their respective gates connected to the differential input signal,
   - a first current source connected to the sources of the first NMOS transistors and a second current source connected to the sources of the first PMOS transistors,
   - the drains of the first NMOS transistors are connected to sources of a set of second identical PMOS transistors,
   - the drains of the first PMOS transistors are connected to sources of a set of second identical NMOS transistors, wherein the second identical PMOS and the second identical NMOS transistors are in a second stage, wherein each of the second identical NMOS transistors and each of the second identical PMOS transistors are symmetrical to each other, and
   - wherein the drain of one of the second PMOS transistors is connected to the drain of one of the set of second identical NMOS transistors, thereby forming a first current path, and
   - wherein the drain of the other of the second PMOS transistors is connected to the drain of the other of the set of second identical NMOS transistors, thereby forming a second current path,
   - wherein the voltage signal between the commonly connected drains defines an output differential signal,
   - a first biasing tree including a first tree PMOS transistor and a first tree NMOS transistor, with drains and gates connected to each other, the source of the first tree PMOS connected to the source of the source of the PMOS in the first current path, wherein the first tree PMOS and the PMOS in the first current path for a first current mirror, and the source of the first tree NMOS connected to the source of the NMOS in the first current path, wherein the first tree NMOS and the NMOS in the first current path form a second current mirror,
   - a second biasing tree including a second tree PMOS transistor and a second tree NMOS transistor, with drains and gates connected to each other, the source of the second tree PMOS connected to the source of the source of the PMOS in the second current path, wherein the second tree PMOS and the PMOS in the second current path form a third current mirror, and the source of the second tree NMOS connected to the source of the NMOS in the second current path, wherein the second tree NMOS and the NMOS in the second current path form a fourth current mirror,
   - wherein all the gates of the PMOS and NMOS transistors in the first and the second current paths and in the first and second biasing trees all are connected together,
   - a third current source connected to the source of the PMOS transistors in the first current path,
   - a fourth current source connected to the source of the PMOS transistors in the first current path, wherein the third current source and the fourth current source are equal to each other and each is of a higher value than the second current source,
   - a fifth current source connected to the sources of the NMOS transistors in the second current path,
   - a sixth current source connected to the sources of the NMOS transistors in the second current path, wherein the fifth current source and the sixth current source are equal to each other and each is of a higher value than the first current source,
   - a third differential stage with a differential input connected to the differential output, and the third differential stage providing a single ended output.

2. The circuit as defined in claim 1 wherein the arrangements of the corresponding sets of transistors and current sources are symmetrical with respect to each other and further comprising the circuit is laid out such that the current paths on either signal path side of the differential topology are identical to each other and further wherein impedances are equal to each other traveling on either signal path side of the differential circuit.

3. The circuit as defined in claim 1 further comprising a buffer inverters defining an input connected to the single ended output and defining a single ended output suitable for driving a number of loads.

4. A low voltage differential amplifier architecture with differential input and output signals, comprising,
   - parallel complementary common source first NMOS and first PMOS transistor pairs with their gates accepting the differential input signal,
   - complementary current sources feeding the source of the first NMOS and first PMOS transistor pairs, the complementary current sources and first NMOS and first PMOS transistor pairs forming a differential input stage, and
   - a second PMOS pair arranged for accepting the drains of the first NMOS pair,
   - a second NMOS pair arranged for accepting the drains of the first PMOS pair, wherein the drains of the second NMOS pair are connected to the corresponding drains of the second PMOS pair, wherein the second NMOS and PMOS pairs form a folded cascode differential output stage, a pair of stacked PMOS and NMOS transistor structures with drains connected together, thereby providing complementary biasing current mirroring stacks for the output cascode second NMOS and second PMOS pairs, and further where the all the gates of the second PMOS and second NMOS and stacked PMOS and stacked NMOS transistors are all connect together, and wherein one of the stacked PMOS sources and the source of one of the second PMOS pair are connected together to a first node, and where the second of the stacked PMOS sources and the source of the other of the second PMOS pair are connected together to a second node, and one of the stacked NMOS sources and the source of one of the second NMOS pair are connected together to a third node, and where the second of the stacked NMOS sources and the source of the other of the second NMOS pair are connected together to a fourth node, and four complementary current sources, one connected to the first node, a second connected to the second node, a third connected to the third node and the fourth connected to the fourth node.

5. The low voltage differential amplifier of claim 4 wherein the first and second current sources are equal to each other and their source complementary current sources are each equal to each other and where each is at least greater than one half the value of the first or second current source.

* * * * *